(12) United States Patent
Chen et al.

(10) Patent No.: US 11,183,568 B2
(45) Date of Patent: Nov. 23, 2021

(54) TWO-DIMENSIONAL SEMICONDUCTOR DEVICE, OPTOELECTRONIC UNIT AND METHOD FOR MAKING THE TWO-DIMENSIONAL SEMICONDUCTOR DEVICE

(71) Applicant: National Tsing Hua University, Hsinchu (TW)

(72) Inventors: I-Tung Chen, Hsinchu (TW); Ying-Yu Lai, Hsinchu (TW); Chun-An Chen, Hsinchu (TW); Xin-Quan Zhang, Hsinchu (TW); Yi-Hsien Lee, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 56 days.

(21) Appl. No.: 16/597,716

(22) Filed: Oct. 9, 2019

(65) Prior Publication Data

US 2020/0312965 A1 Oct. 1, 2020

(30) Foreign Application Priority Data

Mar. 29, 2019 (TW) .................................. 108111228

(51) Int. Cl.
*H01L 29/22* (2006.01)
*H01L 31/032* (2006.01)
(Continued)

(52) U.S. Cl.
CPC .... *H01L 29/2203* (2013.01); *H01L 21/02417* (2013.01); *H01L 29/78* (2013.01);
(Continued)

(58) Field of Classification Search
None
See application file for complete search history.

(56) References Cited

U.S. PATENT DOCUMENTS

| | | | |
|---|---|---|---|
| 2004/0081215 A1* | 4/2004 | Johnson | H01S 5/423 372/50.11 |
| 2004/0144984 A1* | 7/2004 | Knigge | H01S 5/18311 257/79 |
| 2018/0062353 A1* | 3/2018 | Cheng | H01L 31/1852 |

OTHER PUBLICATIONS

Highly Stable Near-Unity Photoluminescence Yield in Monolayer MoS2 by Fluoropolymer Encapsulation and Superacid Treatment, Published on May 3, 2017 (Year: 2017).*

(Continued)

*Primary Examiner* — Khaja Ahmad

(57) ABSTRACT

Disclosures of the present invention mainly describe a two-dimensional semiconductor device (TDSD), comprising: a two-dimensional semiconductor material (TDSM) layer, a superacid action layer and a superacid solution. The TDSM layer is made of a transition-metal dichalcogenide, and the superacid action layer is formed on the TDSM layer. Particularly, an oxide material is adopted for making the superacid action layer, such that the superacid solution is subsequently applied to the superacid action layer so as to make the superacid solution gets into the superacid action layer by diffusion effect. Experimental data have proved that, letting the superacid solution diffuse into the superacid action layer can not only apply a chemical treatment to the TDSM layer, but also make the TDSD have a luminosity enhancement. Particularly, the luminosity enhancement would not be reduced even if the TDSD contacts with water and/or organic solution during other subsequent manufacturing processes.

6 Claims, 7 Drawing Sheets

(51) Int. Cl.
*H01L 21/02* (2006.01)
*H01L 29/78* (2006.01)
*H01L 51/52* (2006.01)
*H01L 45/00* (2006.01)

(52) U.S. Cl.
CPC ........ *H01L 31/0324* (2013.01); *H01L 45/141* (2013.01); *H01L 51/5271* (2013.01)

(56) References Cited

OTHER PUBLICATIONS

Superacid Passivation of Crystalline Silicon Surfaces, published in Aug. 24, 2016 (Year: 2016).*

* cited by examiner (a)

(b)

(c)

(d)

(e)

TWO-DIMENSIONAL SEMICONDUCTOR DEVICE, OPTOELECTRONIC UNIT AND METHOD FOR MAKING THE TWO-DIMENSIONAL SEMICONDUCTOR DEVICE

BACKGROUND OF THE INVENTION

1. Field of the Invention

The present invention relates to the technology field of transition-metal dichalcogenides (TMDCs), and more particularly to a two-dimensional semiconductor device using the TMDCs.

2. Description of the Prior Art

Two-dimensional (2D) transition-metal dichalcogenides (TMDCs) have a chemical formula of $MX_2$, wherein M is a transition metal of the IVB-VIB group in the Periodic Table. On the other hand, X is a chalcophile element (also called chalcogen) coming from the VIA group in the Periodic Table, such as S, Se and Te. A monolayer 2D TMDC has a layer structure of X—M—X, wherein links between respective X atoms and respective M atoms are achieved by covalent bonds in the layer structure. Moreover, a multi-layered 2D TMDC can also be formed by connecting two or more the monolayer 2D TMDCs using van der Waals forces. It is worth particularly explaining that, $MoS_2$ and $WSe_2$ have been applied in the manufacture of photovoltaic devices, photodetectors, fiber lasers, light-emitting diodes (LEDs), or tunneling field-effect transistors (TFETs) because their band gap is found to be adjustable in a range between 0.8 eV and 2.0 eV.

Literature 1 reports that the defect states within a 2D TMDC contribute to non-radiative recombination and accordingly reduce the quantum yield (QY) of photoluminescence (PL) of the 2D TMDC. Literature 1, written by Kim et. al, is entitled with "Highly Stable Near-Unity Photoluminescence Yield in Monolayer $MoS_2$ by Fluoropolymer Encapsulation and Superacid Treatment" and published on ACS Nano, 2017, 11(5), pp. 5179-5185. From the disclosures of literature 1, it is known that among various strategies that have been tried to improve the PL QY of a 2D TMDC by using nonoxidizing organic superacid. For example, bis(trifluoromethane)sulfonamide (TFSI) has been found that is able to dramatically enhance the PL QY of exfoliated $MoS_2$ monolayers. However, while the achievement of the surface-passivated 2D TMDC using TFSI superacid is encouraging, the passivation does not persist during subsequent device fabrication and processing. For instance, the enhancement in PL QY is easily removed after exposure to water and commonly used organic solvents including acetone.

CYTOP, an amorphous perfluorinated polymer with environmental stability and high optical transparency, is proposed in literature 1 for encapsulating TDMCs monolayer. FIG. 1 shows a schematic stereo view of a monolayer TDMCs with superacid and encapsulating material. As FIG. 1 shows, a TDMCs monolayer 1' is formed on a substrate 2', and an encapsulation layer 3' made of CYTOP is formed on the substrate 2' for encapsulating the monolayer TDMCs 1'. A variety of experimental data provided by literature 1 have revealed that, after using the superacid solution to apply a chemical treatment to the monolayer the TDMCs monolayer 1' covered by the encapsulation layer 3', the monolayer TDMCs 1' is therefore has a luminosity enhancement. In addition, the experimental data have also revealed that the luminosity enhancement would not be reduced even if the monolayer TDMCs 1' contacts with water and/or organic solution during other subsequent manufacturing processes.

Briefly speaking, the use of the encapsulation layer 3' made of CYTOP is helpful for preventing the enhancement in PL QY from being removed after exposure to water and commonly used organic solvents. However, it needs to further discuss that, 2D TDMCs are currently applied in photovoltaic devices, photodetectors, fiber lasers, LEDs, and/or TFETs, wherein these devices are all manufactured by using semiconductor processing technologies. Based on this primary reason, the high-temperature resistance and acid-corrosion resistance of CYTOP must be fully considered when adopting the CYTOP for forming the encapsulation layer 3' on the TDMCs monolayer 1'. Moreover, the manufacturing processes of the encapsulation layer 3' also must be determined whether that is compatible with the conventional semiconductor processing technologies or not.

Electronic engineers skilled in design and manufacture of photovoltaic devices, photodetectors, fiber lasers, LEDs, and/or TFETs should know that, it is difficult for the manufacturing processes of the encapsulation layer 3' made of CYTOP to be compatible with the conventional semiconductor processing technologies. From above descriptions, it is therefore know that, how to develop a 2D TDMCs having superacid as well as a manufacture method of the 2D TDMCs which is compatible with the conventional semiconductor processing technologies have now become an important issue. In view of that, inventors of the present application have made great efforts to make inventive research and eventually provided a two-dimensional (2D) semiconductor device, a method for making the 2D semiconductor device, and an optoelectronic unit comprising the 2D semiconductor device.

SUMMARY OF THE INVENTION

The primary objective of the present invention is to provide a two-dimensional (2D) semiconductor device, a method for making the 2D semiconductor device, and an optoelectronic unit comprising the 2D semiconductor device. The 2D semiconductor device comprises: a two-dimensional semiconductor material (TDSM) layer, a superacid action layer and a superacid solution, wherein the TDSM layer is made of a transition-metal dichalcogenide having semiconductor characteristics, and the superacid action layer is formed on the TDSM layer. In the method for making the 2D semiconductor device, an oxide material is adopted for making the superacid action layer, such that the superacid solution is subsequently applied to the superacid action layer so as to make the superacid solution get into the superacid action layer by diffusion effect. Moreover, a variety of experimental data have proved that, letting the superacid solution diffuse into the superacid action layer can not only apply a chemical treatment to the TDSM layer, but also make the TDSD have a luminosity enhancement. In addition, the experimental data have also proved that the luminosity enhancement would not be reduced even if the TDSD contacts with water and/or organic solution during other subsequent manufacturing processes.

In order to achieve the primary objective of the present invention, the inventor of the present invention provides an embodiment of the two-dimensional (2D) semiconductor device, comprising:

a two-dimensional (2D) semiconductor material layer;
a superacid action layer, being formed on the 2D semiconductor material layer; and
a superacid solution, being applied to the superacid action layer, so as to get into the superacid action layer by diffusion effect.

In one embodiment of the 2D semiconductor device, the 2D semiconductor device is applied in an organic light-emitting diode OLED.

In one embodiment of the 2D semiconductor device, the 2D semiconductor device is applied in the manufacture of a light-emitting diode (LED) or a tunneling field-effect transistor (TFET).

In one embodiment of the 2D semiconductor device, the 2D semiconductor device is configured as a light absorbing member so as to be applied in an optoelectronic device selected from the group consisting of photovoltaic device, photodetector, and Q-switched fiber laser.

For achieving the primary objective of the present invention, the inventor of the present invention provides an embodiment of the optoelectronic unit, comprising:
a bottom distributed Bragg reflector mirror;
a two-dimensional (2D) semiconductor device, being disposed on the bottom distributed Bragg reflector mirror, and comprising:
  a two-dimensional (2D) semiconductor material layer;
  a superacid action layer, being formed on the 2D semiconductor material layer; and
  a superacid solution, being applied to the superacid action layer, so as to get into the superacid action layer by diffusion effect; and
a top distributed Bragg reflector mirror, being disposed on the 2D semiconductor device.

In one embodiment of the optoelectronic unit, the optoelectronic unit is configured to a microresonator, and further comprises a buffer layer disposed between the bottom distributed Bragg reflector mirror and the 2D semiconductor material layer, so as to make the buffer layer and the 2D semiconductor device have a thickness greater than 200 nm.

In the embodiment of the optoelectronic unit and the 2D semiconductor device, the 2D semiconductor material layer is made of a material selected from the group consisting of $MoS_2$, $WS_2$ and $WSe_2$.

In the embodiment of the optoelectronic unit and the 2D semiconductor device, the superacid action layer is an oxide layer having a thickness in a range between 5 nm and 100 nm, and the superacid solution comprises a superacid solute and a solvent.

In the embodiment of the optoelectronic unit and the 2D semiconductor device, the superacid solute is a solute selected from the group consisting of bis(trifluoromethane) sulfonamide (TFSI), trifluoromethanesulfonic acid, fluorosulfonic acid, fluoroantimonic acid, magic acid, carboronic acid, and a combination of two or more the foregoing solute, and the solvent is selected from the group consisting of dichloromethane, 1,2-dichloroethylene, 1,2-dichloroethane, chloroform, 1,1,1-trichloroethane, 1,1,2-trichloroethane, trichloroethylene 1,1,2,2-tetrachloroethane, tetrachloroethylene, carbon tetrachloride, and chlorobenzene.

Moreover, in order to achieve the primary objective of the present invention, the inventor of the present invention provides an embodiment of the method for making the 2D semiconductor device, comprising following steps:
(1) providing a two-dimensional (2D) semiconductor material layer;
(2) forming a superacid action layer on the 2D semiconductor material layer; and
(3) applying a superacid solution to the superacid action layer, such that the superacid solution subsequently gets into the superacid action layer by diffusion effect.

In one embodiment of the method, the 2D semiconductor material layer is firstly formed on the substrate, and being subsequently transferred from the substrate to one surface of a target object in the step (1).

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a two-dimensional (2D) semiconductor device, a method for making the 2D semiconductor device, and an optoelectronic unit comprising the 2D semiconductor device disclosed by the present invention, embodiments of the present invention will be described in detail with reference to the attached drawings hereinafter.

Structure of Two-Dimensional (2D) Semiconductor Device

Figure 1:
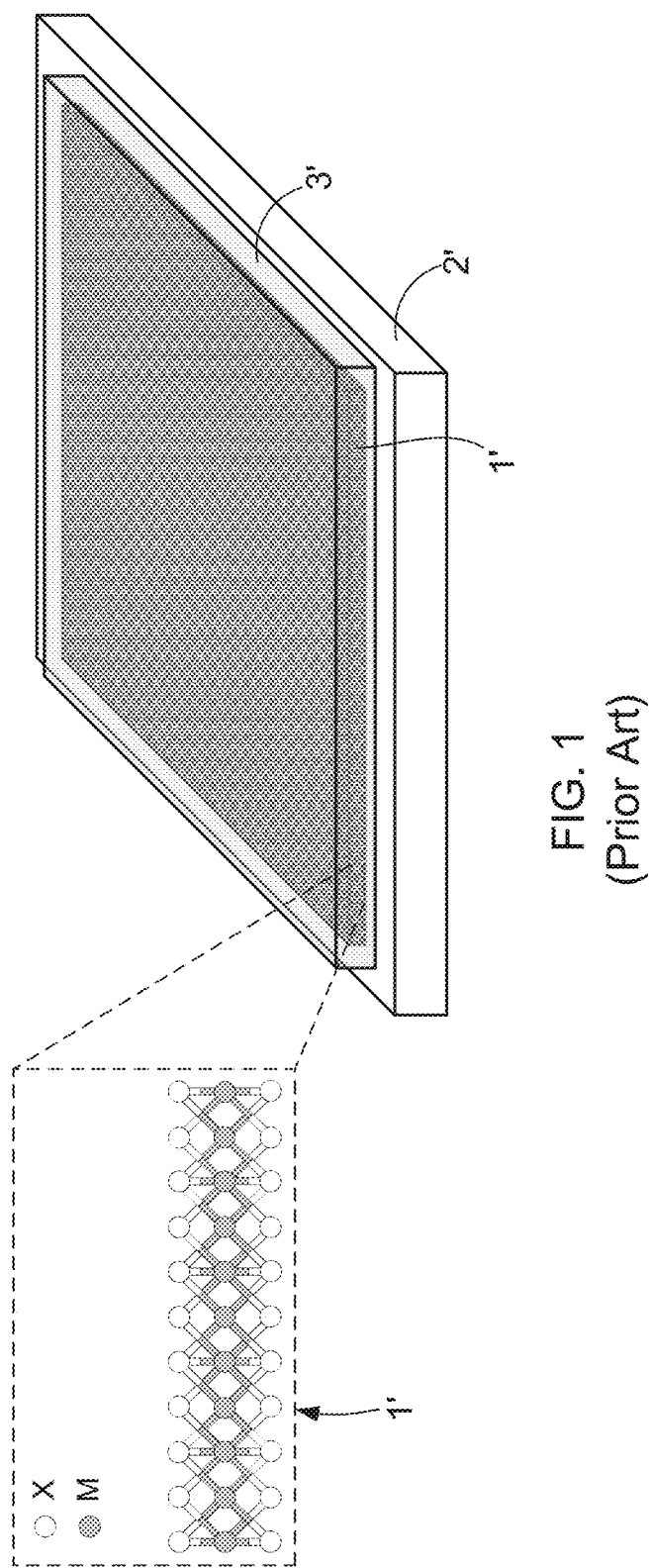
FIG. 1 shows a schematic stereo view of a monolayer TDMCs with superacid and encapsulating material.
Figure 2:
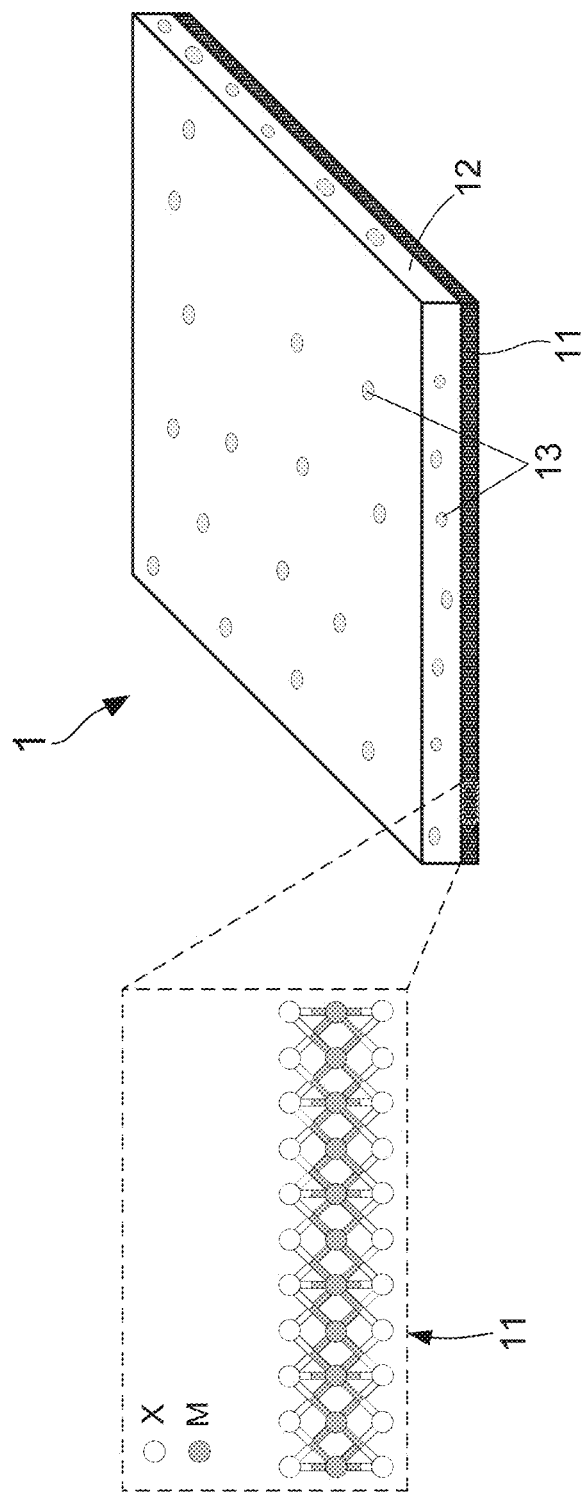
FIG. 2 shows a schematic stereo view of a two-dimensional (2D) semiconductor device according to the present invention.

With reference to FIG. 2, there is a schematic stereo view of a two-dimensional (2D) semiconductor device according to the present invention. As FIG. 2 shows, the 2D semiconductor device 1 of the present invention comprises a two-dimensional (2D) semiconductor material layer 11, a superacid action layer 12 and a superacid solution 13. The 2D semiconductor material layer 11 is made of a transition-metal dichalcogenide (TMDC) having a chemical formula of $MX_2$, wherein M is a transition metal of the IVB-VIB group in the Periodic Table. On the other hand, X is a chalcogen (chalcophile element) coming from the VIA group in the Periodic Table, such as S, Se and Te. A monolayer 2D TMDC has a layer structure of X—M—X, wherein links between respective X atoms and respective M atoms are achieved by covalent bonds in the layer structure. Moreover, a multi-layered 2D TMDC can also be formed by connecting two or more the monolayer 2D TMDCs using van der Waals forces. In the present invention, $MoS_2$, $WS_2$ and $WSe_2$ are adopted for the manufacture of the 2D semiconductor material layer 11 because their band gap is found to be adjustable in a range between 0.8 eV and 2.0 eV.

On the other hand, the a superacid action layer 12 is formed on the 2D semiconductor material layer 11, and has a thickness in a range from 5 nm to 100 nm. According to the particular design of the present invention, the superacid solution 13 is applied to the superacid action layer 12, so as to get into the superacid action layer 12 by diffusion effect. It is worth emphasizing that, the processing way for applying the superacid solution 13 to the superacid action layer 12 should not be limited. For example, the superacid solution 13 can be applied to the superacid action layer 12 by coating, spraying or inkjet printing process. In addition, it can also let the superacid action layer 12 be soaked in the superacid solution 13 for making the superacid solution 13 diffuse into the superacid action layer 12.

In the present invention, the superacid action layer 12 is made of an oxide, such as $SiO_2$, $HfO_2$, $TiO_2$, and $Al_2O_3$. On the other hand, the superacid solution 13 comprises a superacid solute and a solvent, wherein the superacid solute is a solute selected from the group consisting of bis(trifluoromethane)sulfonamide (TFSI), trifluoromethanesulfonic acid, fluorosulfonic acid, fluoroantimonic acid, magic acid, carboronic acid, and a combination of two or more the foregoing solute. Moreover, the solvent is selected from the group consisting of dichloromethane, 1,2-dichloroethylene, 1,2-dichloroethane, chloroform, 1,1,1-trichloroethane, 1,1,2-trichloroethane, trichloroethylene 1,1,2,2-tetrachloroethane, tetrachloroethylene, carbon tetrachloride, and chlorobenzene.

Method for Making the 2D Semiconductor Device

Figure 3:
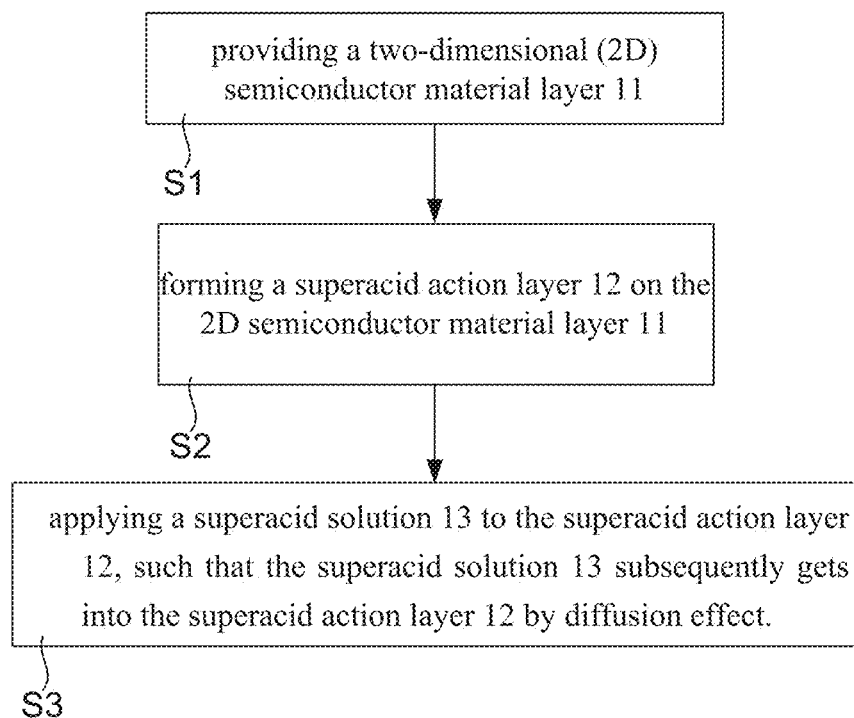
FIG. 3 shows a flowchart diagram of a method for making the 2D semiconductor device according to the present invention.
Figure 4:
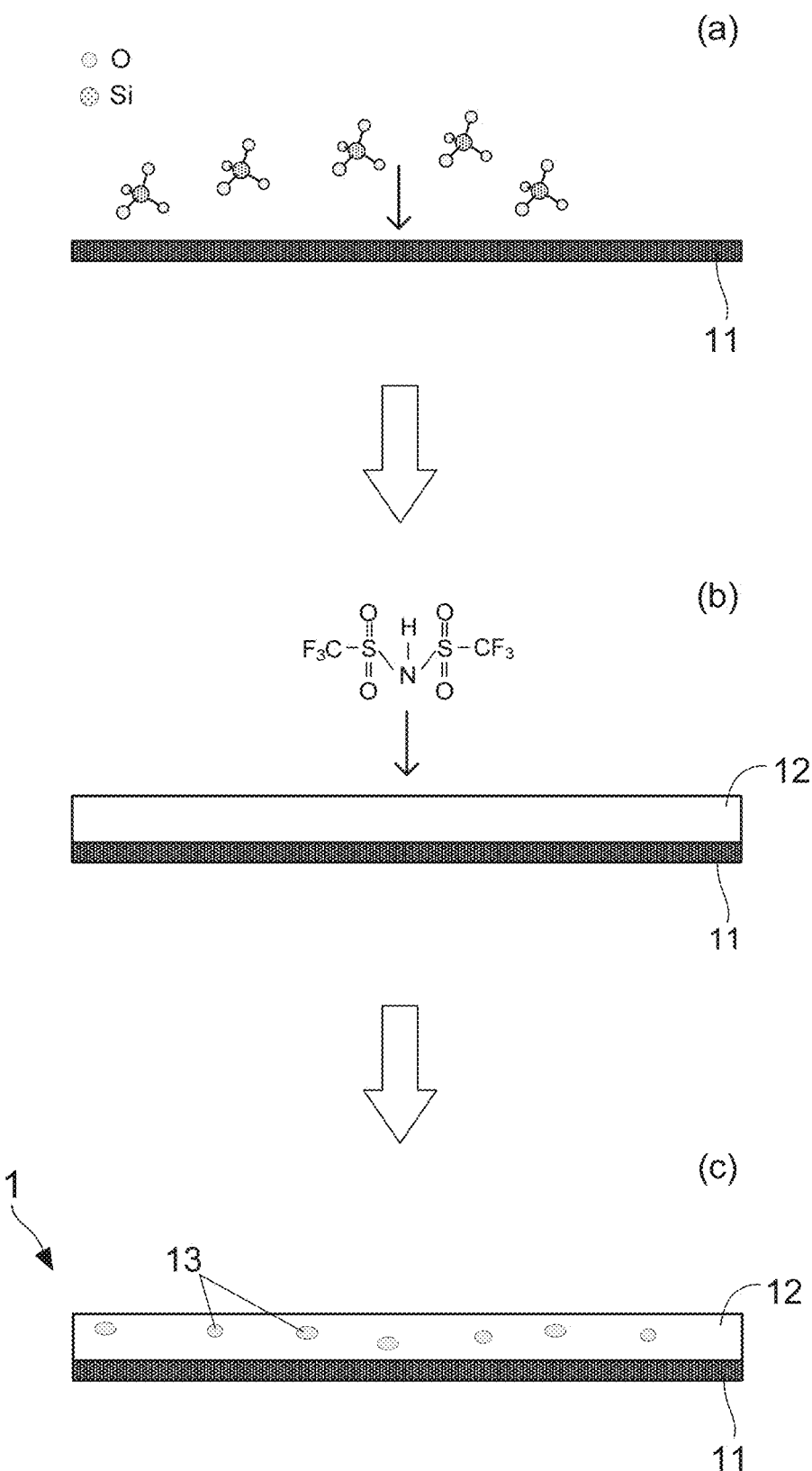
FIG. 4 shows schematic diagrams for describing a manufacturing flow of the 2D semiconductor device.

Please refer to FIG. 3, which shows a flowchart diagram of a method for making the 2D semiconductor device according to the present invention. Moreover, FIG. 4 illustrates schematic diagrams for describing a manufacturing flow of the 2D semiconductor device. As FIG. 3 and FIG. 4 show, step S1 is firstly executed for fabricating the 2D semiconductor device shown as FIG. 3. Herein, it needs to further explain that, the 2D semiconductor material layer 11 is firstly formed on the substrate 10, and is subsequently transferred from the substrate 10 to one surface of a target object, such that the 2D semiconductor material layer 11 is therefore provided. Of course, it is allowed to directly form the 2D semiconductor material layer 11 on the surface of the target object. Si substrate or $SiO_2$ substrate are commonly used as the substrate 10 for carrying the 2D semiconductor material layer 1. However, these two types of substrates should not form a limitation of the embodiments of the substrate 10. In the present invention, the substrate 10 can be a flexible substrate or a solid substrate, wherein the solid substrate is selected from the group consisting of Gallium arsenide (GaAs) substrate, sapphire ($Al_2O_3$) substrate, aluminum nitride (AlN) substrate, spinel substrate, and glass substrate. On the other hand, the flexible substrate is made of a polymer material such as polyethylene terephthalate (PET), polycarbonate (PC), polyimide (PI) substrate, or polyethylene (PE).

Subsequently, method flow is proceeded to step S2 for forming a superacid action layer 12 on the 2D semiconductor material layer 11. As diagram (a) of FIG. 4 shows, $SiO_2$ is adopted for forming a superacid action layer 12 on the 2D semiconductor material layer 11 through atomic layer deposition (ALD). Consequently, method flow is proceeded to step S3 for applying a superacid solution 13 to the superacid action layer 12, such that the superacid solution 13 subsequently gets into the superacid action layer 12 by diffusion effect. From diagrams (b) and (c) of FIG. 4, it is shown that bis(trifluoromethane)sulfonamide (TFSI) is applied to the superacid action layer 12 and subsequently diffuse into the superacid action layer 12.

Experiments

Inventors of the present invention have complete related experiments for proving that letting the superacid solution 13 diffuse into the superacid action layer 12 is helpful for not only applying a chemical treatment to the 2D semiconductor material layer 11 but also make the 2D semiconductor device 1 have a luminosity enhancement. Following Table (1) lists four groups including different testing samples arranged by the inventors, wherein the four groups are respectively control group I, experimental group I, control group II, and experimental group II.

TABLE 1

| Groups | Testing samples |
|---|---|
| control group I | A 2D semiconductor material layer 11, wherein a superacid solution 13 comprising a superacid solute of TFSI and a solvent of $CH_2Cl_2$ is applied to the 2D semiconductor material layer 11. |
| experimental group I | A 2D semiconductor device 1 shown as FIG. 2, which comprises a 2D semiconductor material layer 11, a superacid action layer 12 and a superacid solution 13, and the superacid solution 13 comprising a superacid solute of TFSI and a solvent of $CH_2Cl_2$. |
| control group II | A 2D semiconductor material layer 11, wherein a superacid solution 13 comprising a superacid solute of TFSI and a solvent of $CHCl_3$ is applied to the 2D semiconductor material layer 11. |
| experimental group II | A 2D semiconductor device 1 shown as FIG. 2, which comprises a 2D semiconductor material layer 11, a superacid action layer 12 and a superacid solution 13, and the superacid solution 13 comprising a superacid solute of TFSI and a solvent of $CHCl_3$. |

Figure 5:
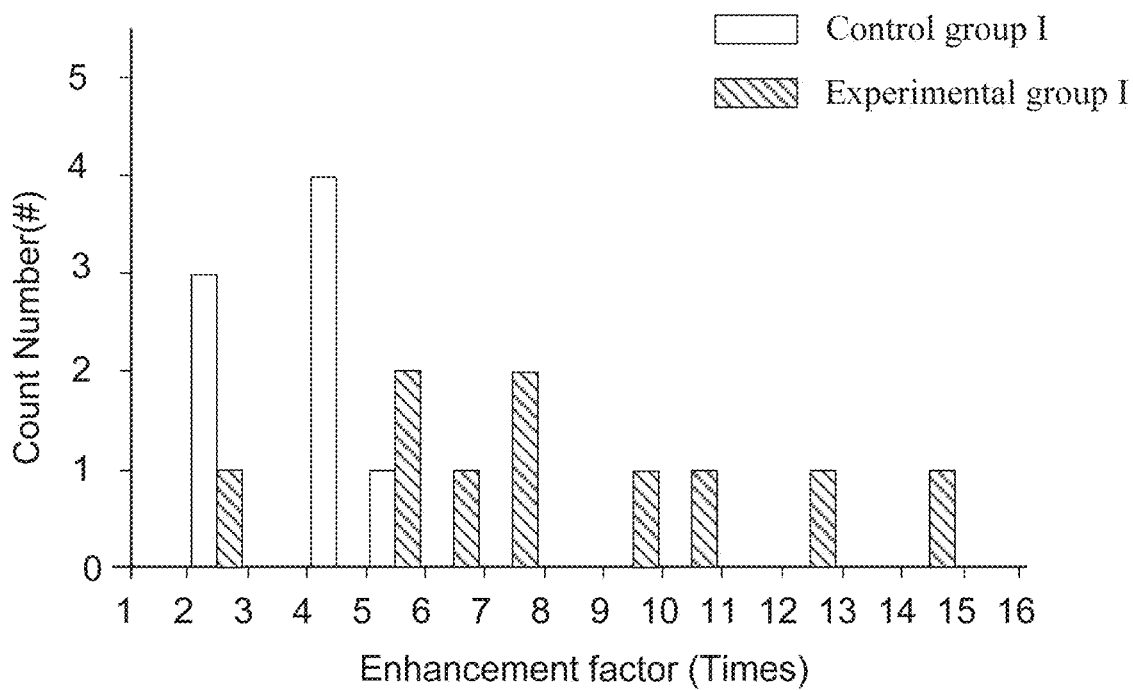
FIG. 5 shows a statistical bar graph of enhancement factor versus count number.
Figure 6:
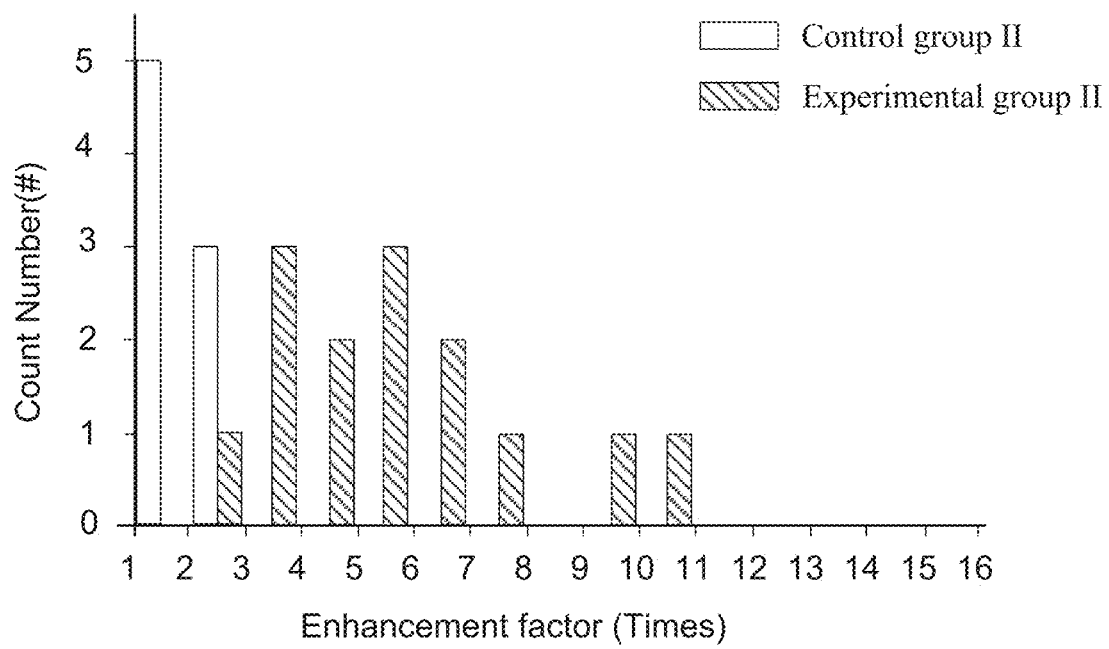
FIG. 6 shows a statistical bar graph of enhancement factor versus count number.

FIG. 5 and FIG. 6 shows respective statistical bar graphs of enhancement factor versus count number. The phrase of count number means sample number, and the term of enhancement factor represents a fold of luminosity enhancement of the 2D semiconductor material layer 11. From the experimental data of FIG. 5 and FIG. 6, it can easily find that, the 2D semiconductor device 1 proposed by the present invention exhibit a relatively high luminous gain after being compared to the 2D semiconductor material layer 11 which has been applied a chemical treatment by the TFSI solution (i.e., superacid solution).

Applications of the 2D Semiconductor Device

Figure 7A:
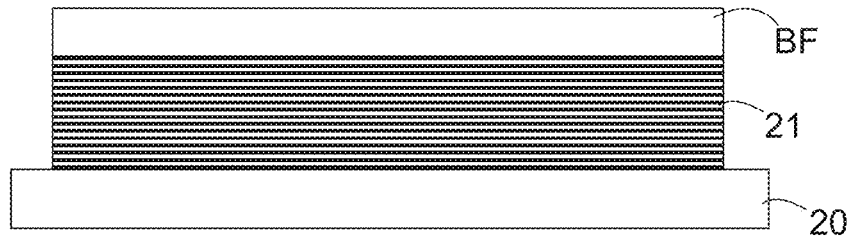
FIG. 7A and FIG. 7B show schematic diagrams for describing an optoelectronic unit having the 2D semiconductor device.
Figure 7A:
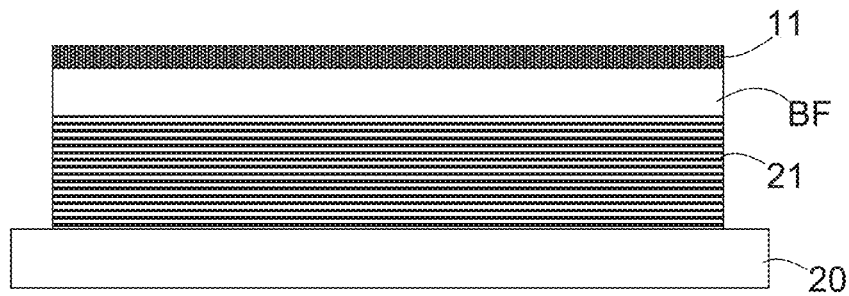
Figure 7A:
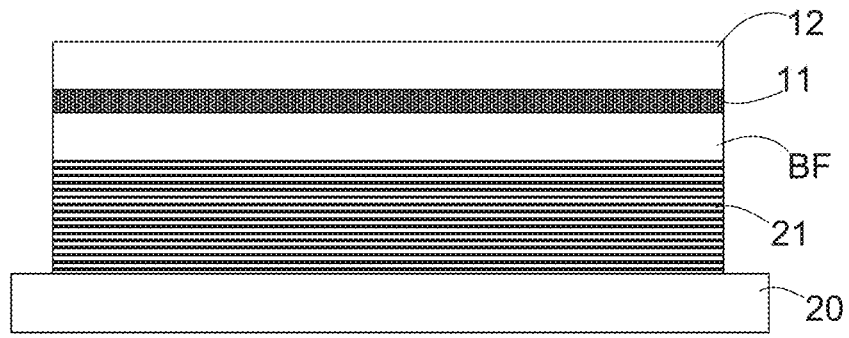
Figure 7B:
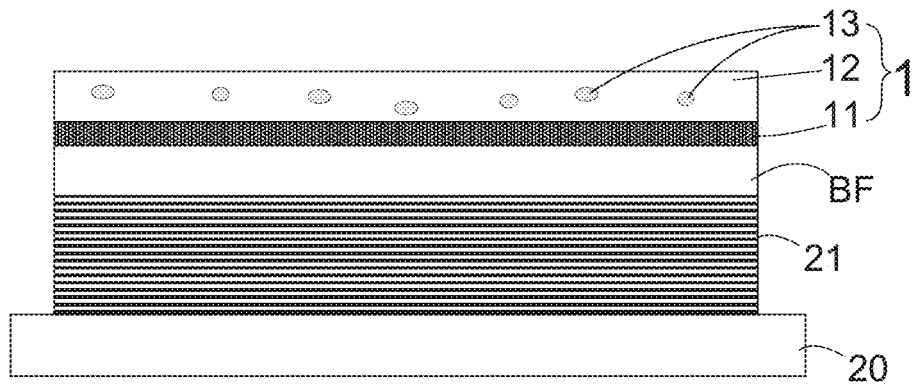
Figure 7B:
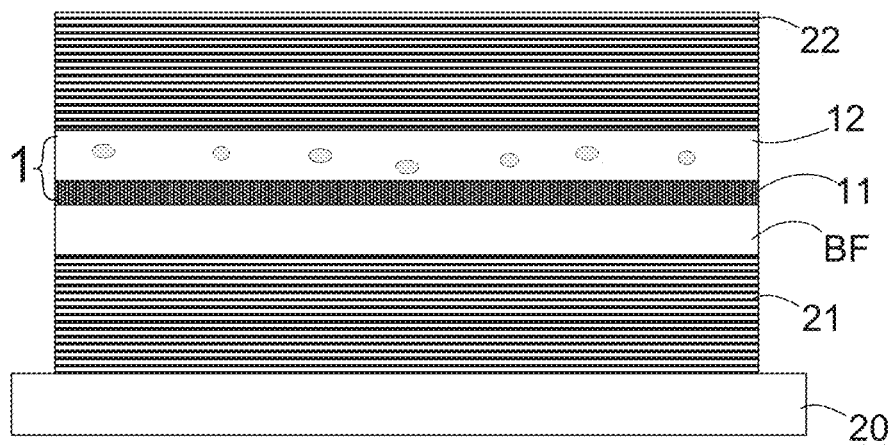

Apparently, related experimental data have proved that, letting the superacid solution 13 diffuse into the superacid action layer 12 can not only apply a chemical treatment to the 2D semiconductor material layer 11, but also make the 2D semiconductor device 1 have a luminosity enhancement. Moreover, the luminosity enhancement would not be reduced even if the 2D semiconductor device 1 contacts with water and/or organic solution during other subsequent manufacturing processes. In addition, above-descriptions also indicate that the 2D semiconductor material layer 11 formed on the substrate 10 can also be further transferred to one surface of a target object with respect to different application of the 2D semiconductor material layer 11. There are schematic diagrams provided in FIG. 7A and FIG. 7B for describing an optoelectronic unit having the 2D semiconductor device. As diagram (a) in FIG. 7A shows, a bottom distributed Bragg reflector (DBR) mirror BBM is provided a buffer layer BF thereon, and the bottom DBR mirror BBM is supported by a substrate 20. Moreover, from diagrams (b)-(c) in FIG. 7A and diagram (d) in FIG. 7B, it is understood that, a 2D semiconductor device 1 can be subsequently formed on the bottom DBR mirror BBM through the steps S1-S3 introduced above. As diagram (e) of FIG. 7B shows, a top distributed Bragg reflector (DBR) mirror TBM is consequently disposed on the 2D semiconductor device 1 comprising the 2D semiconductor material layer 11, the superacid action layer 12 and the superacid solution 13. Electronic engineers skilled in development and manufacture of optoelectronic devices should know that, the optoelectronic unit comprising the bottom DBR mirror BBM, the 2D semiconductor device 1 and the top DBR mirror TBM is a microresonator.

Therefore, FIG. 7A and FIG. 7B discloses that the 2D semiconductor device 1 of the present invention can be applied in the manufacture of a microresonator, wherein the buffer layer BF and the 2D semiconductor device 1 have a thickness greater than 200 nm. However, it needs to particularly emphasize that, the application of the 2D semiconductor device 1 is not limited in the manufacture of the microresonator. In other practicable applications, the 2D semiconductor device 1 of the present invention can also be applied in an organic light-emitting diode (OLED) for enhancing the luminous efficiency of the OLED. On the other hand, the 2D semiconductor device 1 can also be applied in the manufacture of a light-emitting diode (LED). Moreover, the 2D semiconductor device 1 can also be configured as a gate isolation layer of a tunneling field-effect transistor (TFET). Furthermore, in other practicable applications, the 2D semiconductor device 1 is configured as a light absorbing member so as to be applied in an optoelectronic device selected from the group consisting of photovoltaic device, photodetector, and Q-switched fiber laser.

The above description is made on embodiments of the present invention. However, the embodiments are not intended to limit scope of the present invention, and all equivalent implementations or alterations within the spirit of the present invention still fall within the scope of the present invention.

What is claimed is:

1. An optoelectronic unit, being a microresonator, and comprising:
   a bottom distributed Bragg reflector mirror;
   a two-dimensional (2D) semiconductor device, being disposed on the bottom distributed Bragg reflector mirror for being used as a gain medium so as to make a lighting device integrated with the optoelectronic unit has a luminosity enhancement, and comprising:
   a two-dimensional (2D) semiconductor material layer;
   a superacid action layer, being formed on the 2D semiconductor material layer, and having a thickness in a range between 5 nm and 100 nm, wherein the superacid action layer is made of an oxide material selected from a group consisting of $SiO_2$, $HfO_2$, $TiO_2$, and $Al_2O_3$; and
   a superacid solution, being applied to the superacid action layer, so as to get into the superacid action layer by diffusion effect; and
   a top distributed Bragg reflector mirror, being disposed on the 2D semiconductor device.

2. The optoelectronic unit of claim 1, further comprising a buffer layer BF disposed between the bottom distributed Bragg reflector mirror and the 2D semiconductor material layer, so as to make the buffer layer and the 2D semiconductor device have a thickness greater than 200 nm.

3. The optoelectronic unit of claim 1, wherein the 2D semiconductor material layer is made of a material selected from the group consisting of $MoS_2$, $WS_2$ and $WSe_2$.

4. The optoelectronic unit of claim 1, the superacid solution comprises a superacid solute and a solvent.

5. The optoelectronic unit of claim 4, wherein the superacid solute is a solute selected from the group consisting of bis(trifluoromethane)sulfonamide (TFSI), trifluoromethanesulfonic acid, fluorosulfonic acid, fluoroantimonic acid, magic acid, carboronic acid, and a combination of two or more the foregoing solute.

6. The optoelectronic unit of claim 4, wherein the solvent is selected from the group consisting of dichloromethane, 1,2-dichloroethylene, 1,2-dichloroethane, chloroform, 1,1,1-trichloroethane, 1,1,2-trichloroethane, trichloroethylene 1,1,2,2-tetrachloroethane, tetrachloroethylene, carbon tetrachloride, and chlorobenzene.

* * * * *